United States Patent
Tu

(10) Patent No.: US 6,853,024 B1
(45) Date of Patent: Feb. 8, 2005

(54) SELF-ALIGNED MIM CAPACITOR PROCESS FOR EMBEDDED DRAM

(75) Inventor: Kuo-Chi Tu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/679,098

(22) Filed: Oct. 3, 2003

(51) Int. Cl.$^7$ ............... H01L 27/108; H01L 29/76; H01L 29/94; H01L 31/119
(52) U.S. Cl. ............... 257/301; 257/304; 257/305
(58) Field of Search ............... 257/301, 304, 257/305

(56) References Cited

U.S. PATENT DOCUMENTS

| | | |
|---|---|---|
| 6,211,061 B1 | 4/2001 | Chen et al. |
| 6,271,084 B1 | 8/2001 | Tu et al. |
| 6,381,165 B1 * | 4/2002 | Lee et al. ............... 365/51 |
| 6,661,051 B1 * | 12/2003 | Durcan et al. ............... 257/306 |
| 2001/0010378 A1 * | 8/2001 | Matsubara et al. ............... 257/303 |
| 2002/0011618 A1 * | 1/2002 | Ishibashi et al. ............... 257/301 |
| 2003/0141531 A1 * | 7/2003 | Aihara ............... 257/301 |

* cited by examiner

Primary Examiner—Ngân V. Ngô
(74) Attorney, Agent, or Firm—Slater & Matsil, L.L.P.

(57) ABSTRACT

A semiconductor device includes a group of capacitors and a trench. Each capacitor includes a first conductive material layer, a dielectric layer, and a second conductive material layer. The dielectric layer is located between the first and second conductive material layers. The first conductive material layer coats an inside surface of a cup-shaped opening formed in an insulating layer. The trench is formed in the insulating layer. The trench extends between and crosses each of the capacitors in the group. The dielectric layer and the second conductive material layer are formed over the first conductive material layer in the cup-shaped openings and over an inside surface of the trench. The second conductive material layer extends between the capacitors of the group via the trench. Also, the second conductive material layer forms top electrodes for the capacitors of the group.

10 Claims, 17 Drawing Sheets

SELF-ALIGNED MIM CAPACITOR PROCESS FOR EMBEDDED DRAM

TECHNICAL FIELD

The present invention generally relates to semiconductor devices. In one aspect it relates more particularly to a self-aligned MIM capacitor process for use in embedded DRAM devices.

BACKGROUND

While merging logic circuits and DRAM arrays on a single chip, one should consider their compatibility in both design and fabrication. FIG. 1 shows cross-section view for part of a single chip having a logic region 30 and an embedded DRAM array region 32. In the DRAM region 32 shown in FIG. 1, metal-insulator-metal (MIM) capacitors 34 are used at each DRAM cell. Each MIM capacitor 34 shown in FIG. 1 includes a top electrode-to-bottom electrode design with a contact-to-top electrode isolation rule.

Decreasing device dimensions continue to create needs for new solutions to DRAM cell array isolation rule limitations. In the prior design shown in FIG. 1, the overlap margin 36 between the top plate electrode contact 38 and the bit line contact 40 may be insufficient in this design as device dimensions shrink. In other words, as device dimensions shrink, it becomes increasingly difficult to provide precise alignment to ensure that the top electrode contact 38 of the MIM capacitor 34 does not overlap with the bit line contact 40. Some minimum margin must exist between the bit line contact 40 and the contact 38 for the top plate electrode 42 for the DRAM device portion 32 to function properly. Hence, a need exist for an improved design to address this overlap margin window to allow for decreased device dimensions in future chips.

SUMMARY OF THE INVENTION

The problems and needs outlined above are addressed by embodiments of the present invention. In accordance with one aspect of the present invention, a semiconductor device is provided. The semiconductor device includes a group of capacitors and a trench. The group of capacitors are located at least partially in an insulating layer. Each capacitor includes a bottom electrode, a dielectric layer, and a top electrode. At least part of the dielectric layer is located between the bottom and top electrodes. The bottom electrode is formed in a cup-shaped opening. The cup-shaped opening is formed in the insulating layer. The dielectric layer and the top electrode are formed over the bottom electrode in the cup-shaped opening. The trench is formed in the insulating layer. The trench connects between and crosses each of the capacitors in the group. The trench forms a recess in the bottom electrode where the trench crosses the bottom electrode. A conductive material is formed in the trench. The conductive material electrically connects the top electrodes of the capacitors in the group. In a preferred embodiment, the conductive material is integrally formed from the same material of the top electrode when the top electrode material is formed. In other embodiments, however, the conductive material in the trench may be formed from a different material than the top electrode material of the capacitors. The group of capacitors may be storage capacitors forming parts of embedded dynamic random access memory cells on a chip that also includes a logic circuit region, for example.

In accordance with another aspect of the present invention, a method of fabricating a semiconductor device is provided. This method includes the following the steps, the order of which may vary. An intermediate structure having an insulating layer formed on top is provided. A group of cup-shaped openings is formed in the insulating layer. A first conducting material is deposited over the structure such that the first conducting material substantially coats the inside of the cup-shaped openings. Excess portions of the first conducting material, if any, are removed from a top surface of the structure. A trench is formed in the insulating layer. The trench extends between the cup-shaped openings of the group and crosses each of the cup-shaped openings of the group. Also, the trench forms a recess in the first conducting material where the trench crosses the cup-shaped openings. A dielectric material is deposited over the structure such that the dielectric material substantially coats the inside of the trench and substantially coats exposed surfaces of the first conducting material. A second conducting material is deposited over the structure such that the second conducting material substantially coats the inside of the trench and substantially coats the exposed surfaces of the dielectric material. Excess portions of the second conducting material, if any, are removed from a top surface of the structure. The semiconductor device may include dynamic random access memory cells having storage capacitors formed at the cup-shaped openings, for example. As another example application, the semiconductor device may include a logic circuit region and an embedded dynamic random access memory region, wherein the embedded dynamic random access memory region includes storage capacitors formed at the cup-shaped openings.

In accordance with yet another aspect of the present invention, a semiconductor device is provided. The semiconductor device includes a group of capacitors and a trench. The group of capacitors is located at least partially in an insulating layer. Each capacitor includes a first conductive material layer, a dielectric layer, and a second conductive material layer. At least part of the dielectric layer is located between the first and second conductive material layers. The first conductive material layer coats an inside surface of a cup-shaped opening. The cup-shaped opening is formed in the insulating layer. The trench is formed in the insulating layer. The trench extends between and crosses each of the capacitors in the group. The trench forms a recess in the first conductive material layer where the trench crosses the first conductive material layer at the capacitors. The dielectric layer and the second conductive material layer are formed over the first conductive material layer in the cup-shaped openings and over an inside surface of the trench. The second conductive material layer extends between the capacitors of the group via the trench. Also, the second conductive material layer forms top electrodes for the capacitors of the group.

BRIEF DESCRIPTION OF THE DRAWINGS

The following is a brief description of the drawings, which show illustrative embodiments of the present invention and in which.

DETAILED DESCRIPTION OF ILLUSTRATIVE EMBODIMENTS

Figure 1:
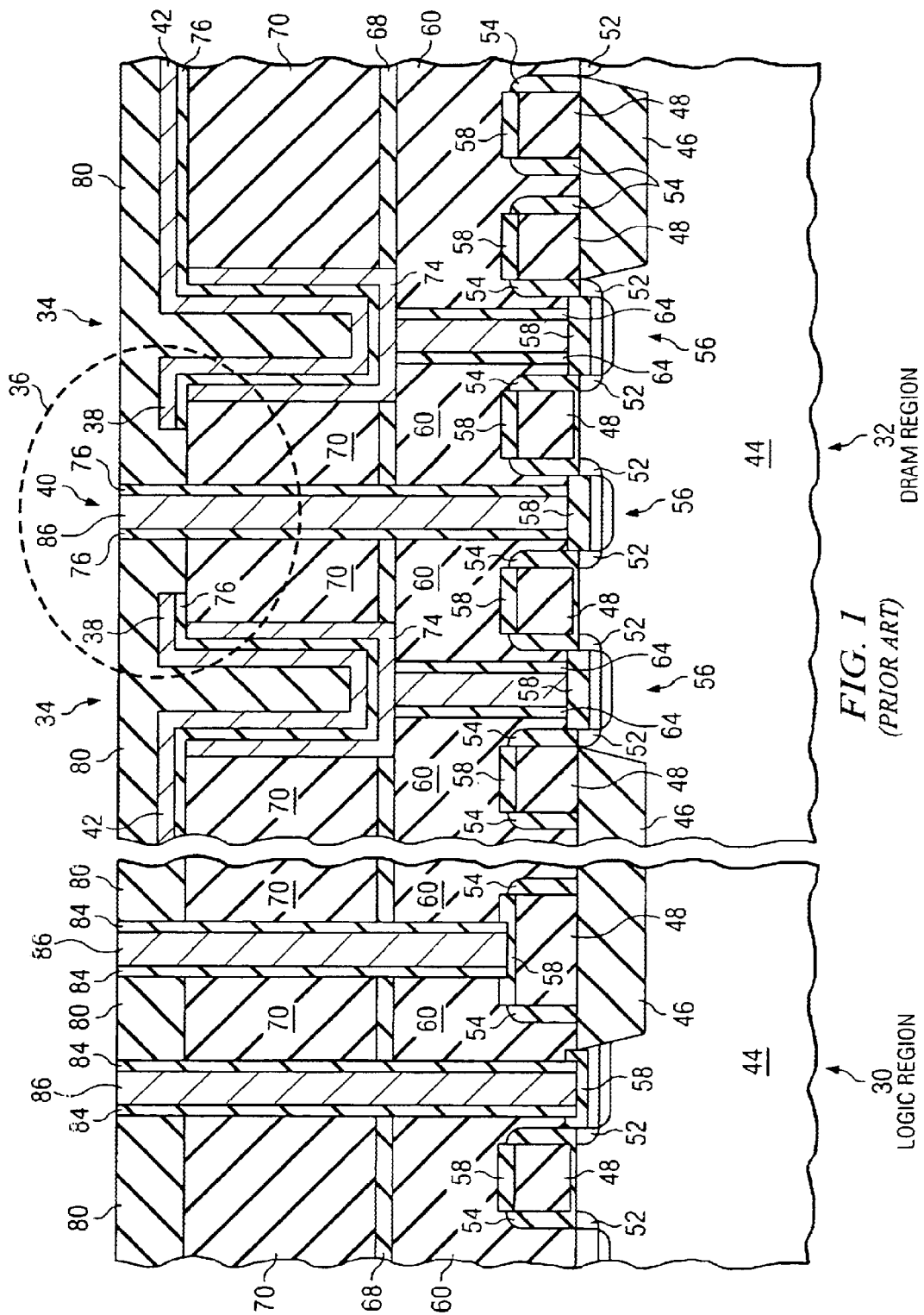
FIG. 1 shows cross-section view for part of a single chip having a logic region and an embedded DRAM array region in accordance with a prior design.

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIG. 1 shows cross-section view for part of a single chip having a logic region 30 and an embedded DRAM array region 32, in accordance with a prior design. In the DRAM region 32 shown in FIG. 1, metal-insulator-metal (MIM) capacitors 34 are used at each DRAM cell. Each MIM capacitor 34 shown includes a top electrode-to-bottom electrode design with a contact-to-top electrode isolation rule. As mentioned above, the overlap margin 36 between the top plate electrode contact 38 and the bit line contact 40 for the design shown in FIG. 1 may be insufficient as device dimensions shrink. As device dimensions shrink, it becomes increasingly difficult to provide precise alignment to ensure that the top electrode contact 38 of the MIM capacitor 34 does not overlap with the bit line contact 40. For the DRAM device portion 32 to function properly, some minimum margin must exist between the bit line contact 40 and the contact 38 for the top plate electrode 42.

Next, an illustrative method of forming an illustrative embodiment of the present invention will be described with reference to FIGS. 2–24. In FIGS. 2–24, some of the process steps are shown to illustrate the fabrication integration for the logic and DRAM regions. Not every process step is shown in detail, as some of the intermediate steps should be apparent to one of ordinary skill in the art. The particular device layout shown is merely one illustrative example for using an embodiment of the present invention. With the benefit of this disclosure, other possible device layouts that may benefit from incorporating a method and/or an embodiment of the present invention may be realized by one of ordinary skill in the art.

Figure 2:
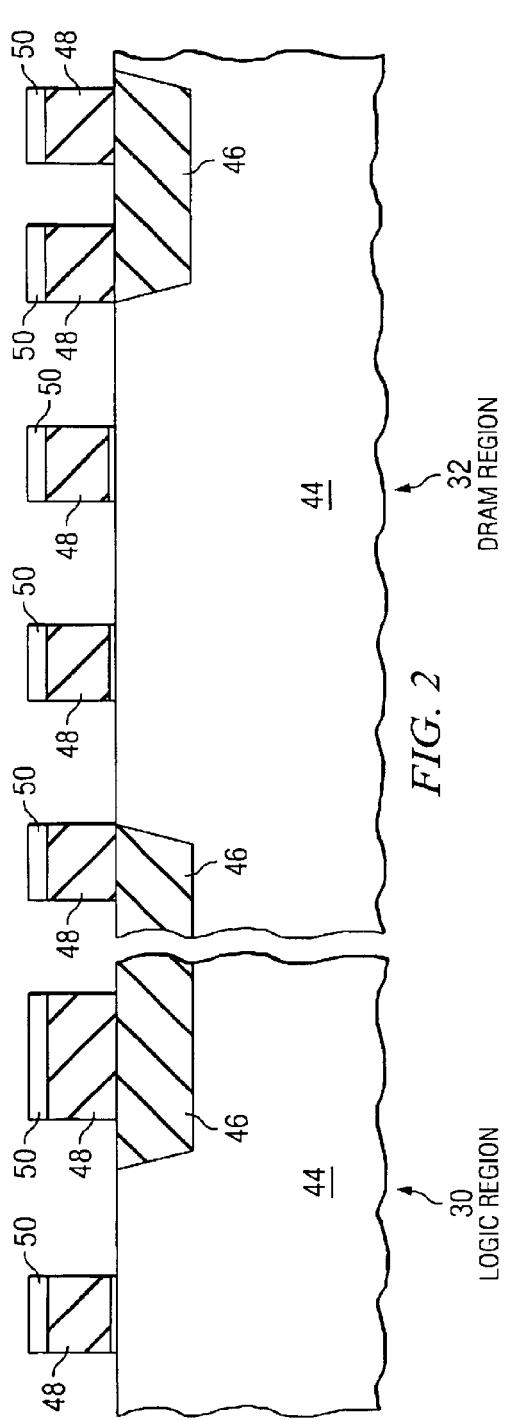
FIGS. 2–6 are cross-section views for intermediate structures of an illustrative embodiment formed by an illustrative method of the present invention.
Figure 3:
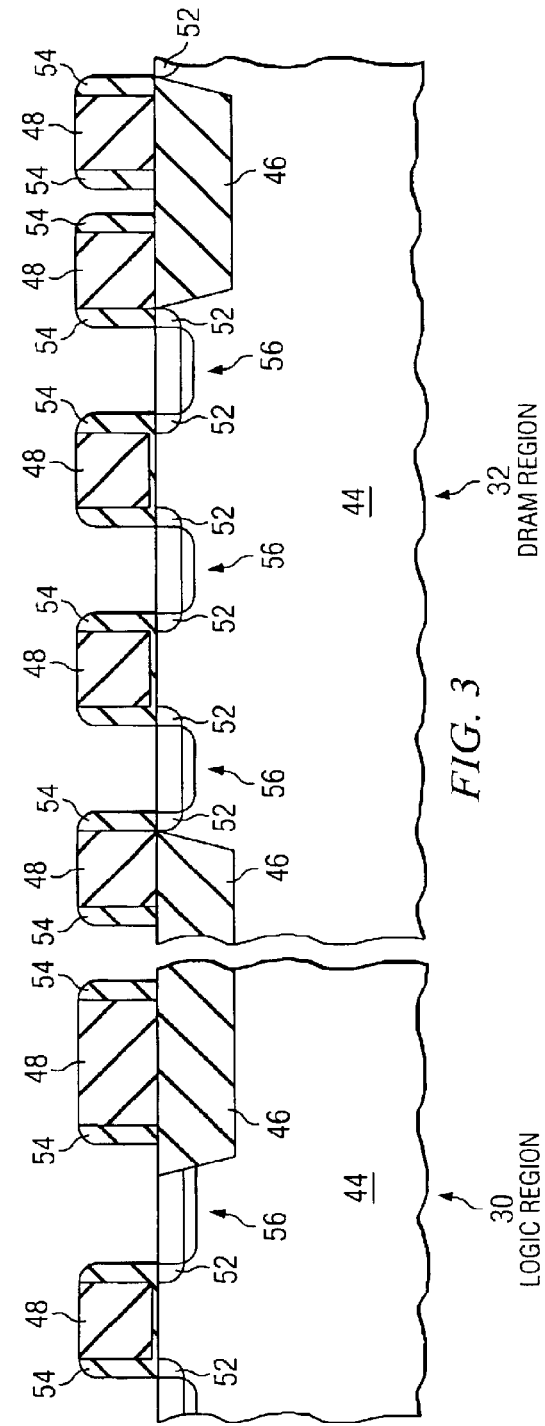
Figure 4:
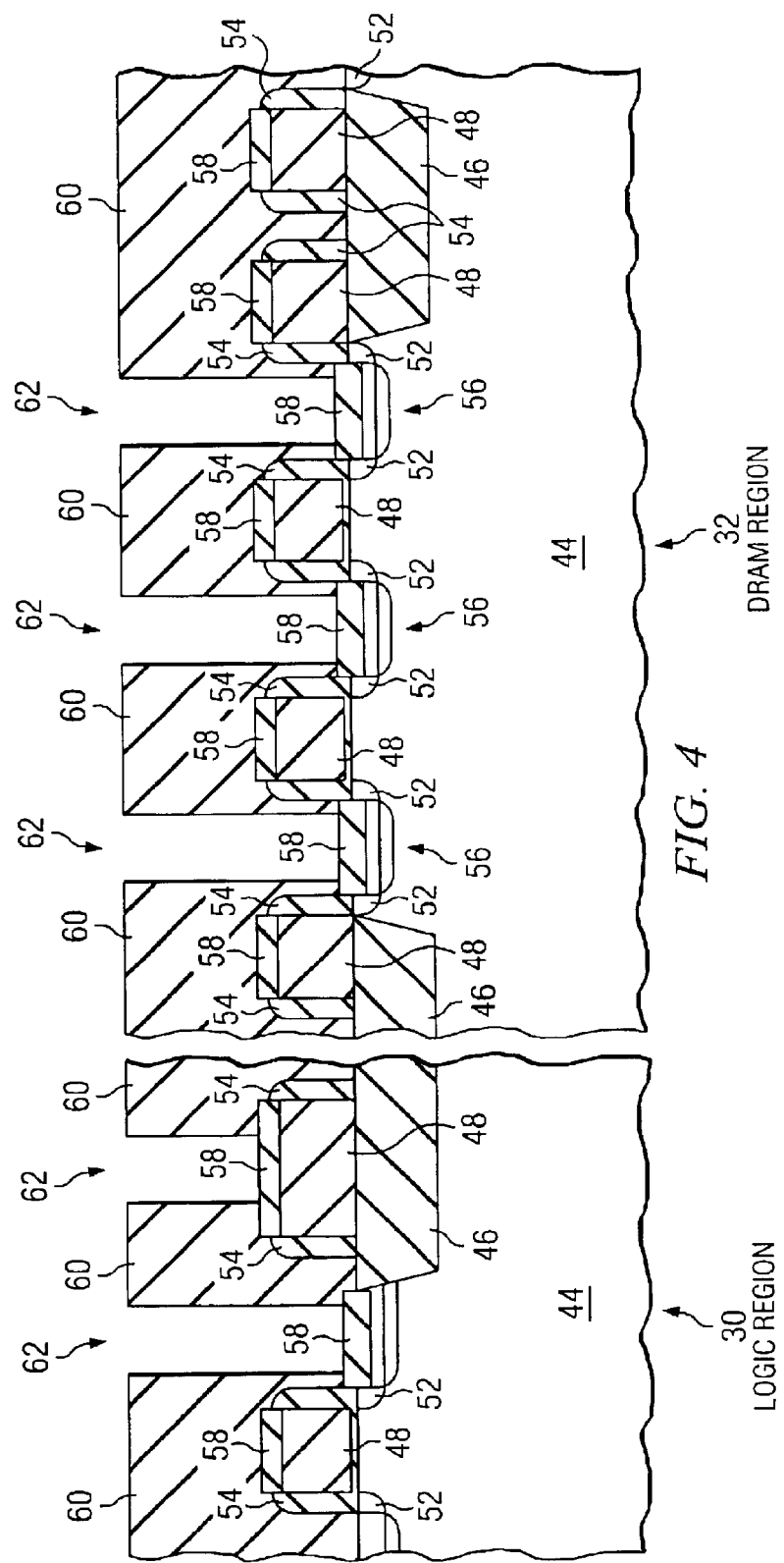

Focusing first on the DRAM region 32 shown in FIG. 2, a gate oxide has been deposited on a substrate 44 having shallow trench isolation portions 46 formed therein. A gate material 48 (e.g., polysilicon) and a mask 50 (e.g., SiON) are deposited and patterned, as shown in FIG. 2. Next, the mask 50 is striped, portions 52 of the substrate 44 are doped (LDD implant), spacers 54 are formed, and the substrate 44 is further doped in alignment with the spacers 54 to form source/drain regions 56 (e.g., N+/P+implant), as shown in FIG. 3. Self-aligned silicide 58 is formed over the source and drain regions 56, as shown in FIG. 4. Also in FIG. 4, a first insulating layer 60 (e.g., oxide) is deposited and planarized (e.g., using CMP). Openings 62 are formed in the insulating layer 60 for contacts in the logic region 30 and storage node contacts in the DRAM region 32 (see FIG. 4).

Figure 5:
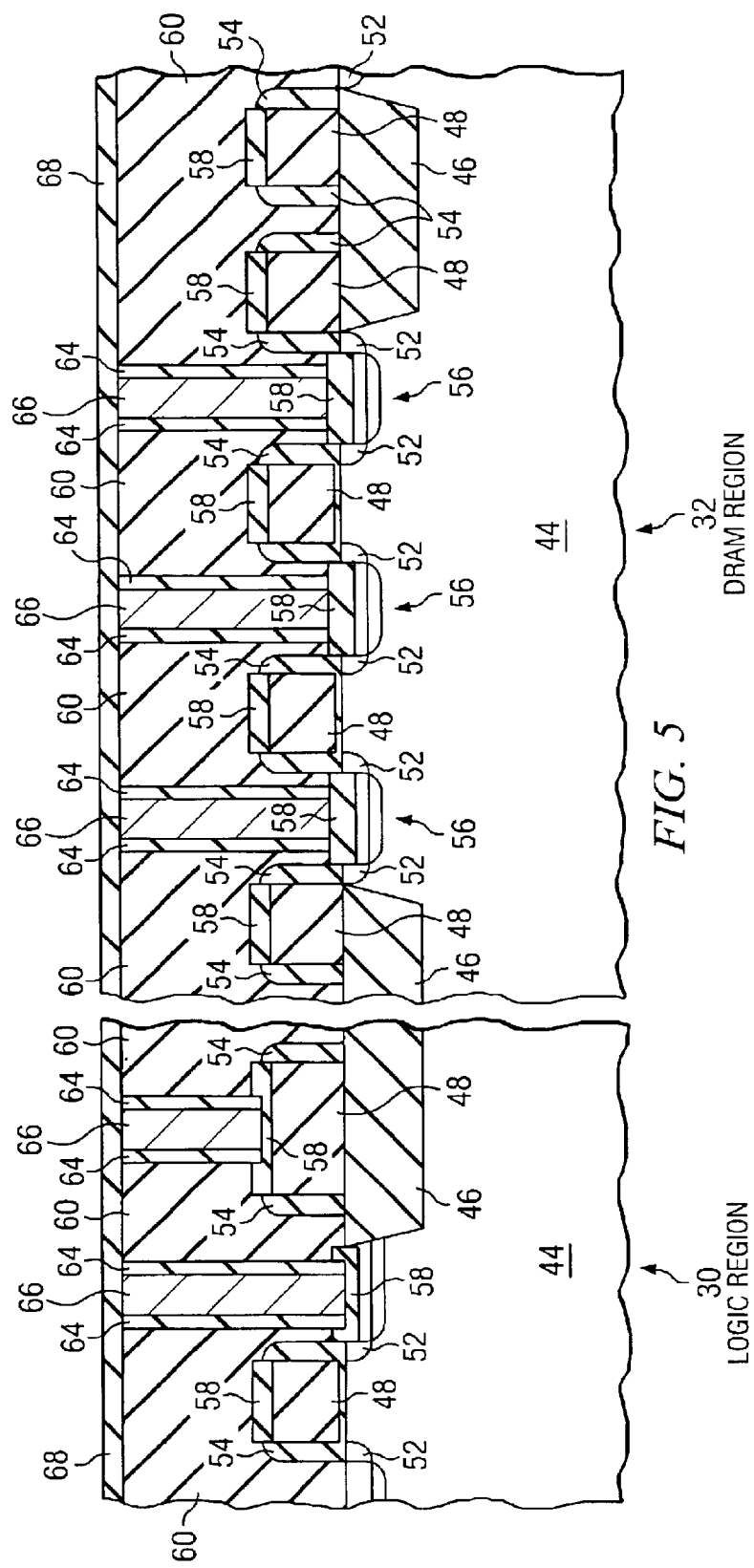
Figure 6:
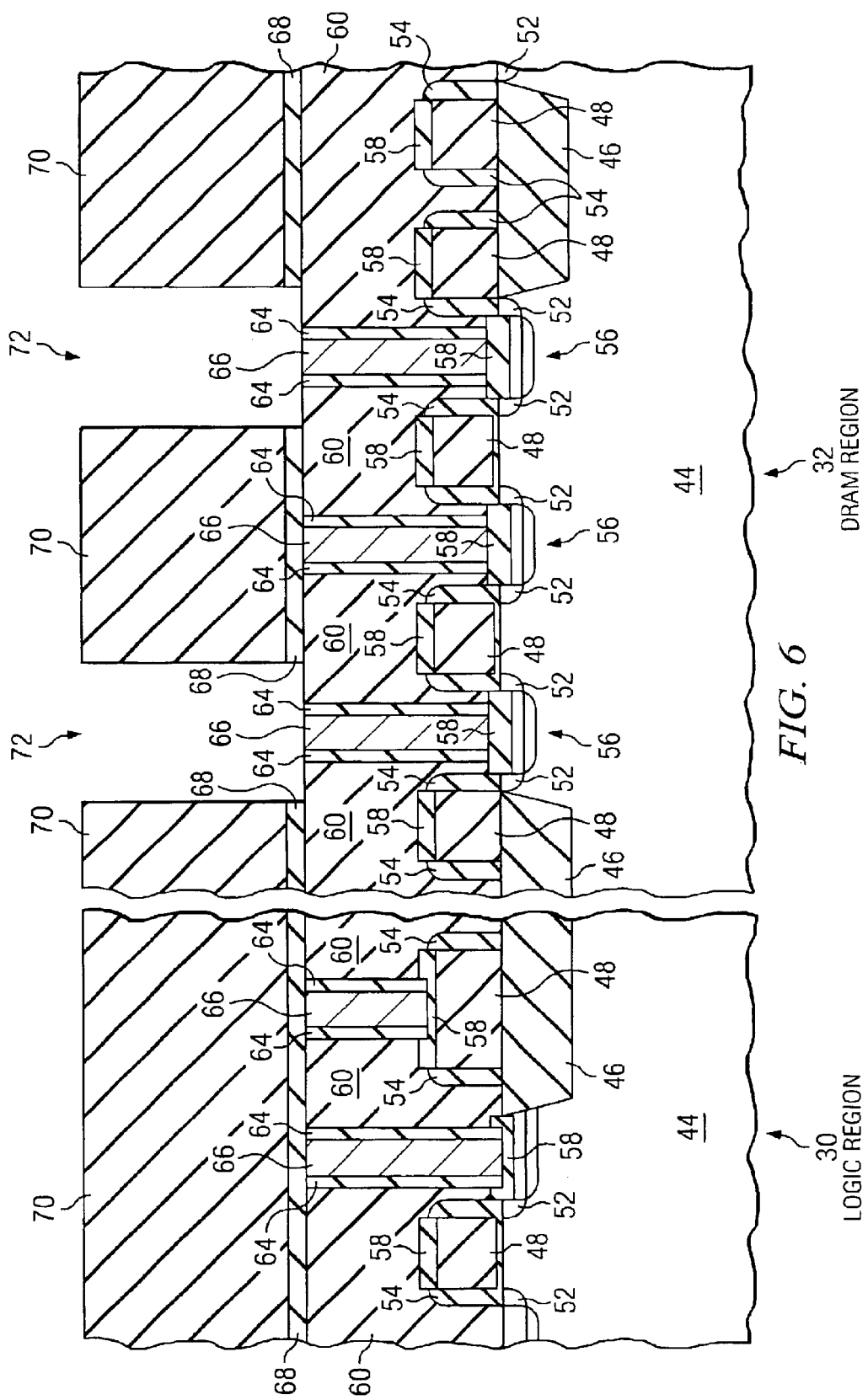

Referring now to FIG. 5, a barrier layer 64 may be deposited in the contact openings 62, followed by contact material deposition to fill the openings. The contact material 66 (e.g., tungsten) may need to be planarized (e.g., using etch back or CMP) to remove excess material and provide a planar upper surface of the intermediate structure. Also, as shown in FIG. 5, an etch stop layer 68 (e.g., $Si_3N_4$) may be deposited for use in subsequent steps. One of the advantages of this process is that the logic devices 30 and the DRAM devices 32 are formed simultaneously. As shown in FIG. 5, the transistors and contacts for both regions 30, 32 are formed using the same processing steps for optimizing integration and minimizing fabrication steps. In FIG. 6, a second insulating layer 70 has been deposited and patterned to form cup-shaped openings 72 for the MIM storage capacitors.

Figure 9:
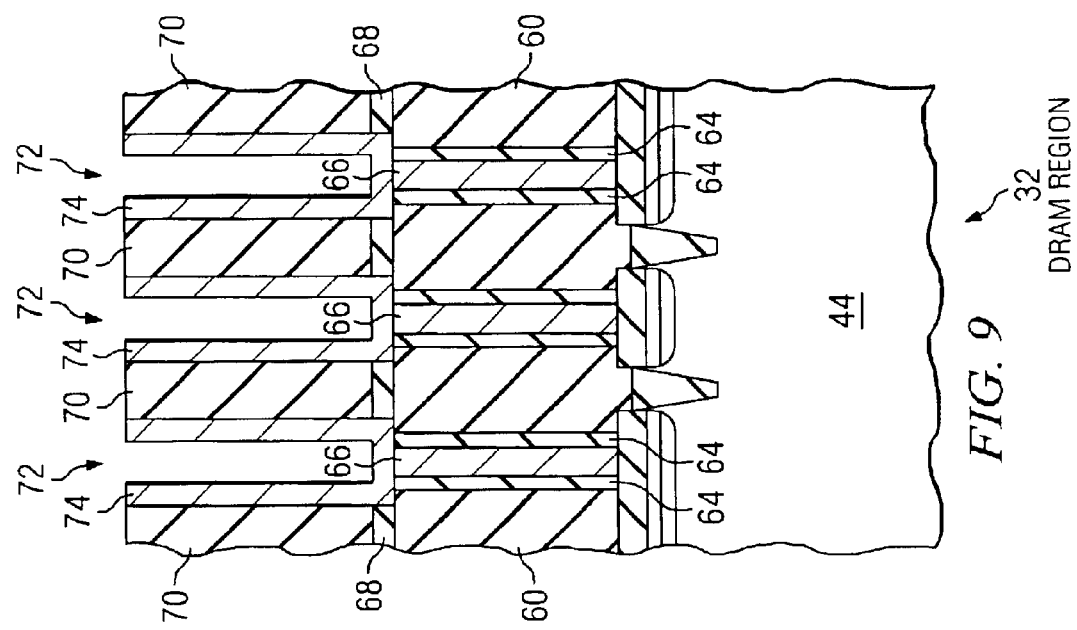
FIG. 9 is a cross-section view taken along curved line 9—9 in FIG. 7.
Figure 7:
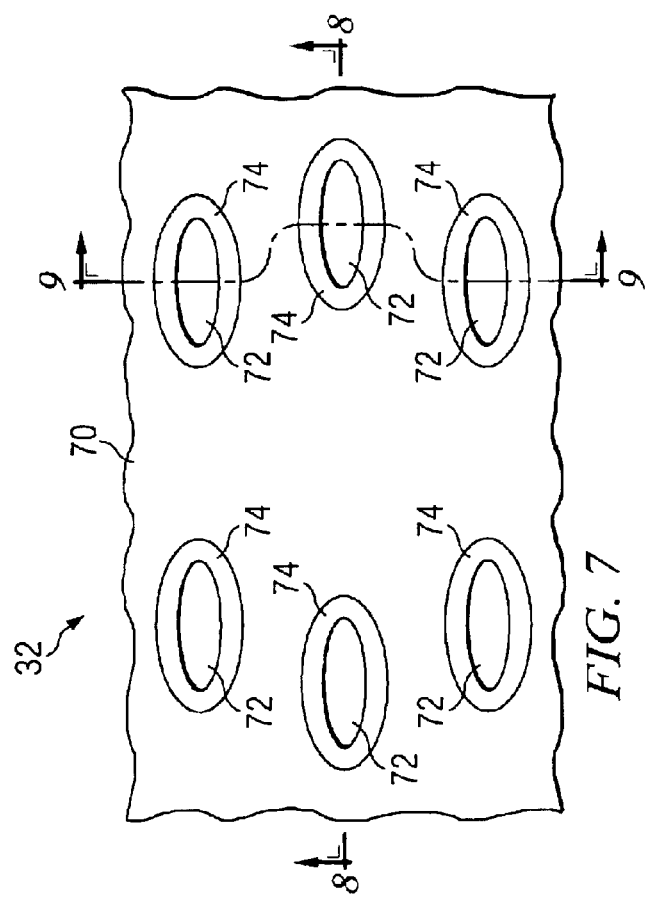
FIG. 7 is a top view of another intermediate structure of the illustrative embodiment at the DRAM region, subsequent to the intermediate structure shown in FIG. 6.
Figure 8:
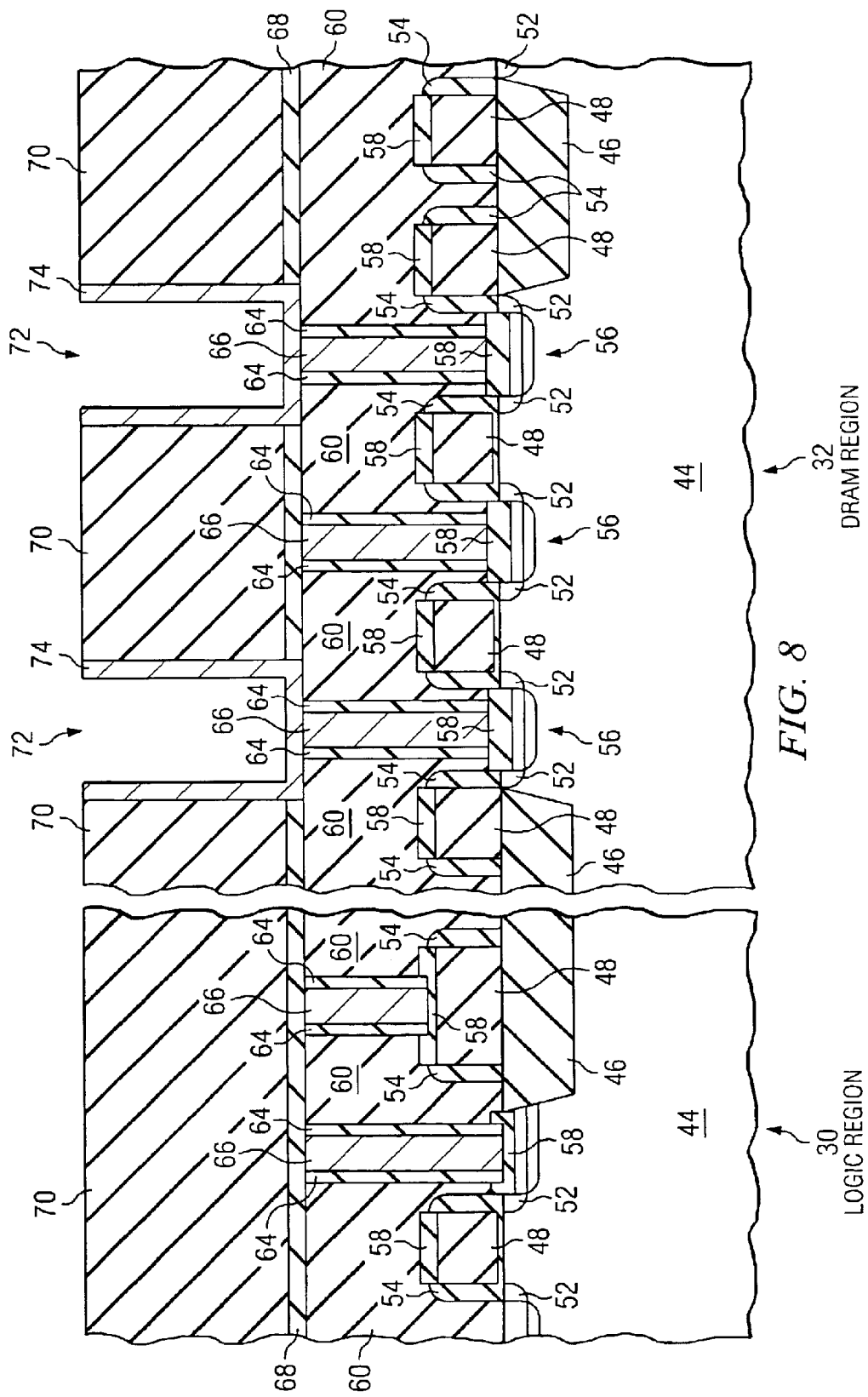
FIG. 8 is a cross-section view taken along line 8—8 in FIG. 7.

FIGS. 7–9 show different views of a next intermediate structure of the devices being fabricated. At this stage, bottom electrode material 74 (e.g., TiN) is deposited in the capacitor openings 72. Excess bottom electrode material may need to be removed (e.g., by etch back or CMP) to provide the structure shown in FIGS. 7–9. FIG. 7 is a top view of the DRAM region 32. FIG. 8 is a cross-section view (as in FIGS. 1–6) taken along line 8—8 of FIG. 7. FIG. 9 is a cross-section view taken along the curved line 9—9 of FIG. 7. Although the cup-shaped openings 72 shown in this illustrative embodiment have an generally oval-shaped cross-section and generally flat bottoms, the cup-shaped openings may have any of a variety of different cross-sections shapes and bottoms, including but not limited to: a generally rectangular cross-section shape, a round cross-section shape, an arbitrarily-shaped cross-section shape, a rounded bottom, a jagged bottom, or any combination thereof, for example.

Figure 10:
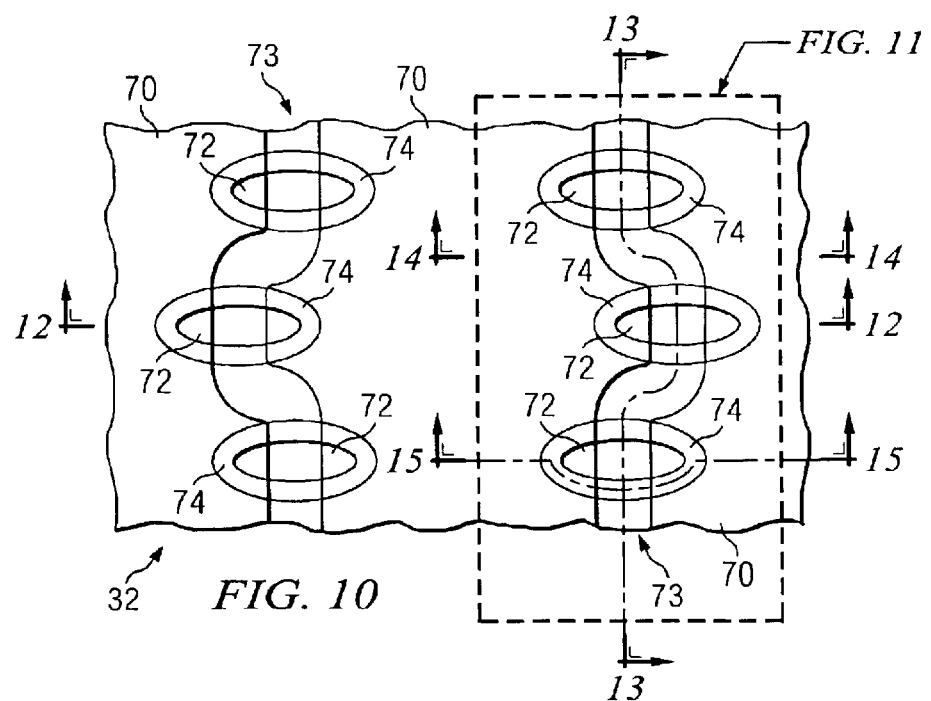
FIG. 10 is a top view of an intermediate structure of the illustrative embodiment at the DRAM region, subsequent to the intermediate structure shown in FIGS. 7–9.
Figure 11:
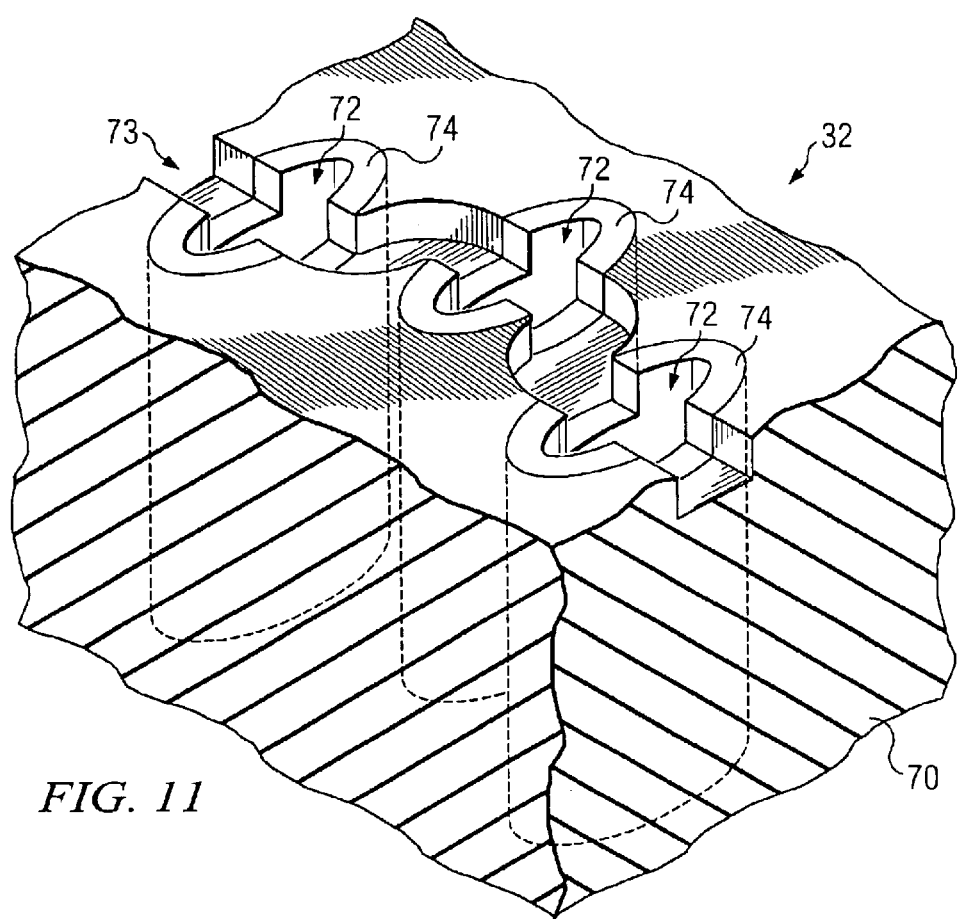
FIG. 11 is a perspective view of the area outlined with the dashed-line in FIG. 10.
Figure 12:
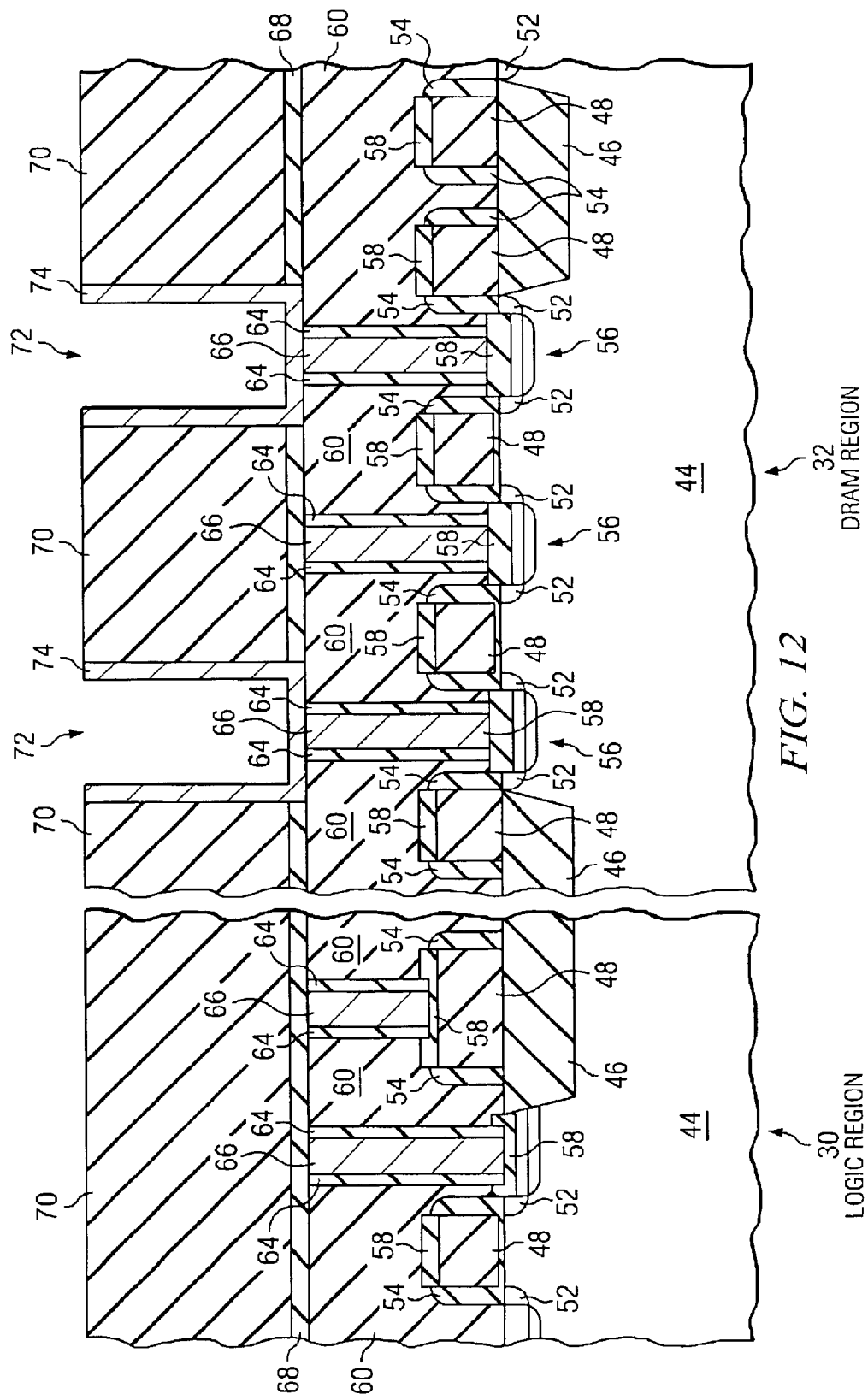
FIG. 12 is a cross-section view taken along line 12—12 in FIG. 10.
Figure 14:
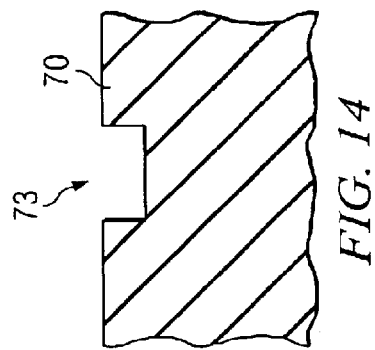
FIG. 14 is a cross-section view of the curved trench, as taken along line 14—14 in FIG. 10.
Figure 15:
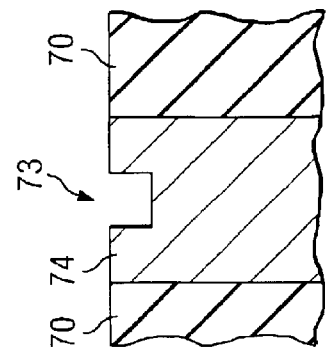
FIG. 15 is a cross-section view of the curved trench, as taken along curved line 15—15 in FIG. 10.
Figure 13:
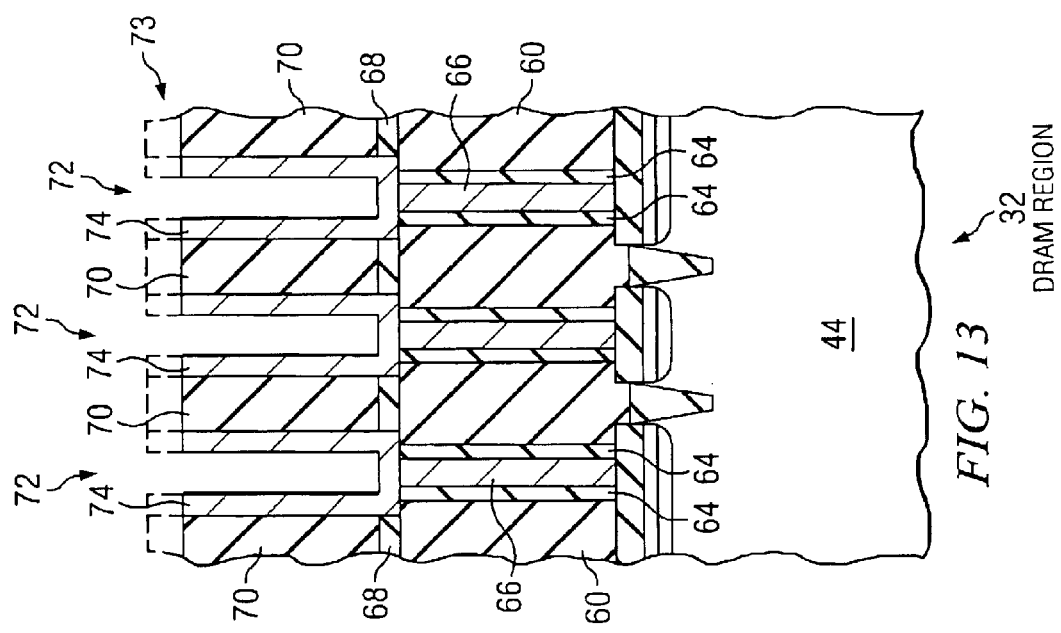
FIG. 13 is a cross-section view taken along curved line 13—13 in FIG. 10.

The next step in the fabrication process is to form curved trenches 73 in the DRAM region 32 that cross groups of capacitor locations 72, as shown in FIGS. 10–15. FIG. 10 is a top view of the DRAM region 32. FIG. 11 is an enlarged perspective view for a portion of the DRAM region 32 outlined with a dashed line in FIG. 10. FIG. 12 is a cross-section view (as in FIGS. 1–6) taken along line 12—12 of FIG. 10. FIG. 13 is a cross-section view taken along the curved line 13—13 of FIG. 10. In FIG. 13, the prior structure of FIG. 9 is shown in phantom lines for comparison. FIG. 14 is a cross-section view of the trench 73 taken along line 14—14 of FIG. 10. FIG. 15 is a cross-section view of the trench 73 cutting through the bottom electrode, as taken along curved line 15—15 of FIG. 10. As shown in FIGS. 11 and 15, the trench 73 is formed into the bottom electrode 74 where it crosses each capacitor location 72. The depth and width of the trenches 73 may vary, as needed to vary the design parameters of an embodiment. Although the trenches 73 shown in this illustrative embodiment have generally rectangular cross-section shapes, a trench 73 may have any of a variety of different cross-sections shapes, including but not limited to: a generally rounded-bottom cross-section shape, an arbitrarily-shaped cross-section, a pentagon cross-section shape, a hexagon cross-section shape, or any combination thereof, for example. Also, although the trenches 73 of this illustrative embodiment have curved shapes where they extend between capacitor locations 72, a trench 73 may have any of a variety of different shapes as it extends between capacitor locations 72, including but not limited to: curves, sine-wave-shaped, straight, angled, a series of straight sections joined together forming angles between the straight sections, arbitrarily shaped, or any combination thereof, for example.

Figure 16:
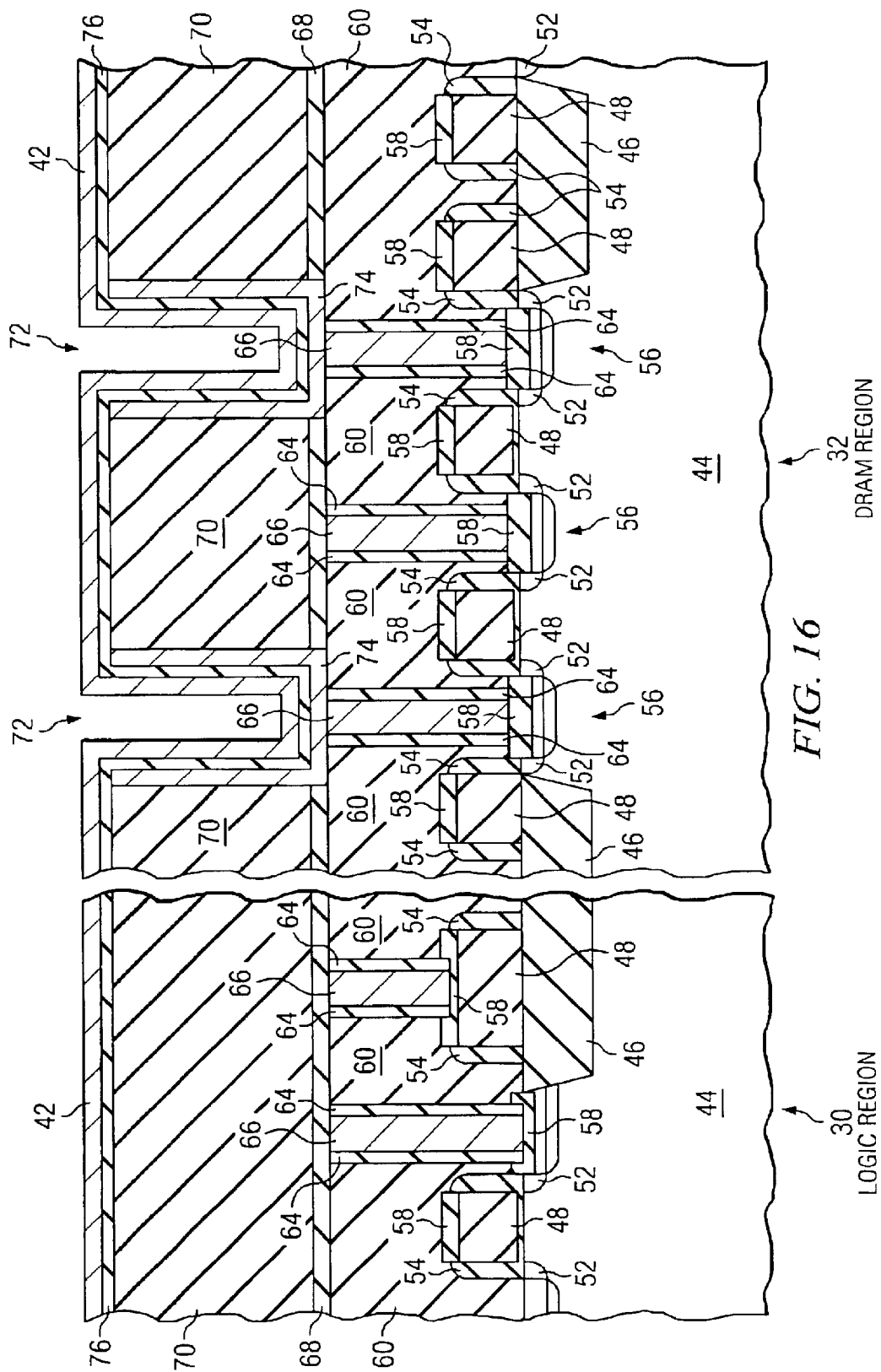
FIGS. 16 and 17 are cross-section views of an intermediate structure of the illustrative embodiment subsequent to the structure shown in FIGS. 10–15.
Figure 18:
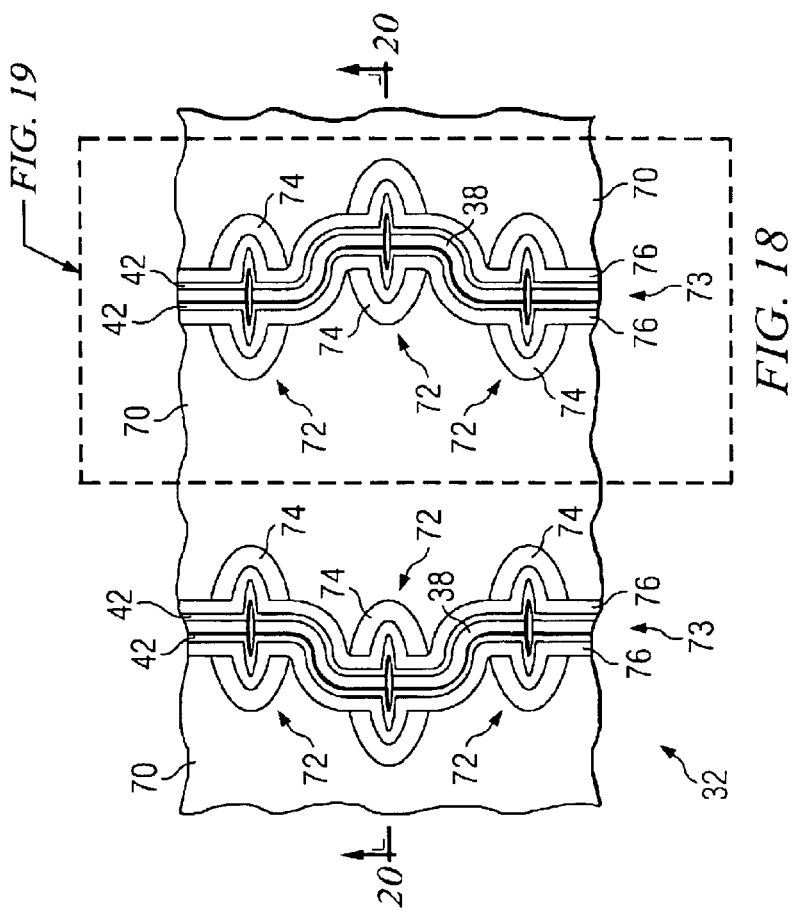
FIG. 18 is a top view of an intermediate structure of the illustrative embodiment at the DRAM region, subsequent to the intermediate structure shown in FIGS. 16 and 17.
Figure 17:
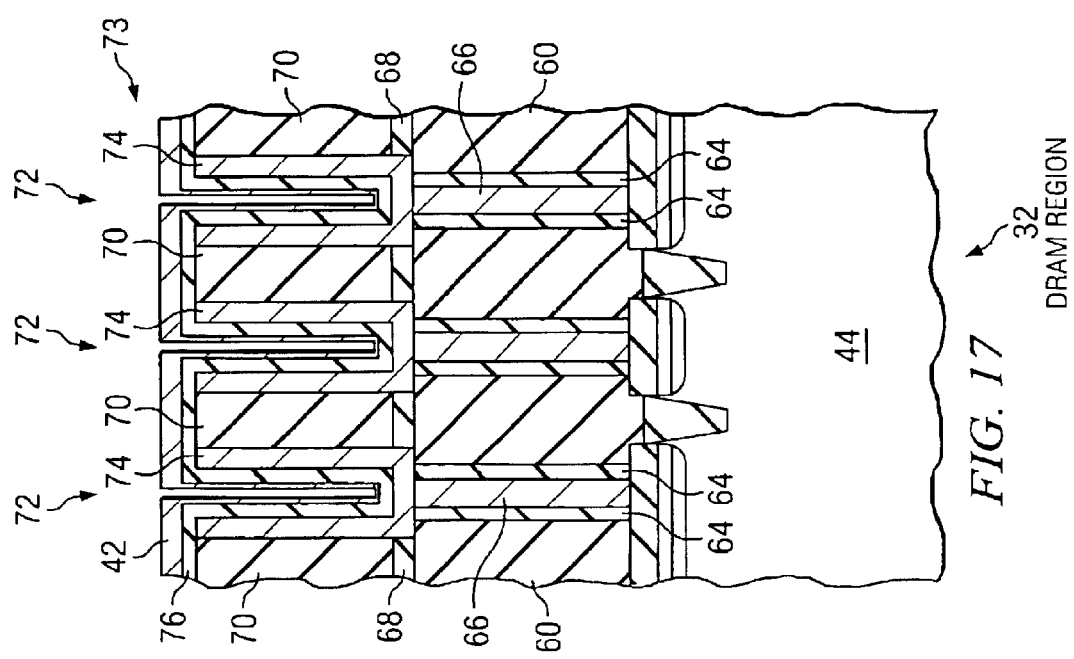
Figure 19:
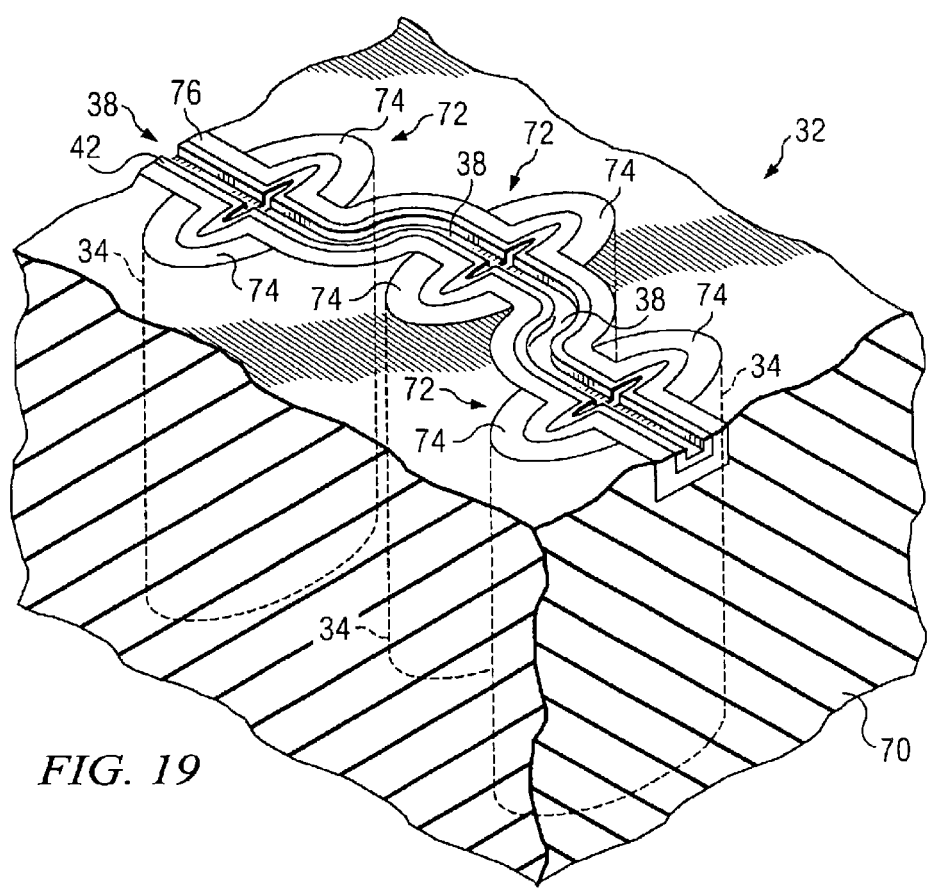
FIG. 19 is a perspective view of the area outlined with the dashed-line in FIG. 18.
Figure 20:
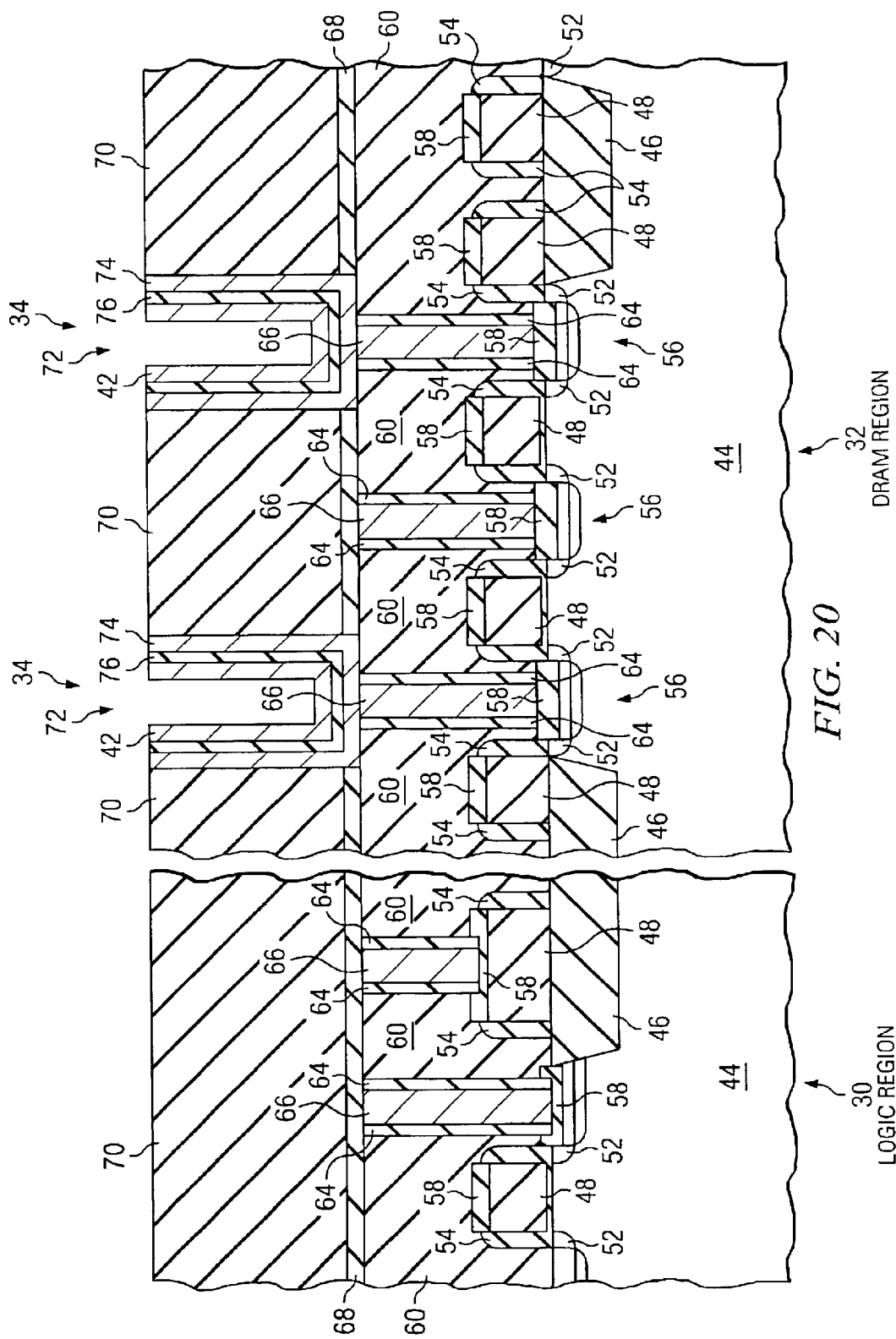
FIG. 20 is a cross-section view taken along line 20—20 in FIG. 18.

Referring now to FIGS. 16 and 17, an insulting film 76 is deposited over the structure of FIGS. 10–15, which coats the exposed surfaces of the bottom electrode 74 (preferably in a conformal manner). Preferably, the insulating film 76 is a high-dielectric-constant material (e.g., $Ta_2O_5$, $SrTiO_3$, $Al_2O_3$). After depositing the insulating film 76, top electrode material 42 (e.g., TiN) is deposited over the insulating film 76. Excess top electrode material may be removed (e.g., by etch back or CMP) to provide the structure shown in FIGS. 18–20. FIG. 19 is an enlarged perspective view of a portion of FIG. 18 in the DRAM region 32 to illustrate some of the capacitors 34 and the DRAM array structure at this stage. Because the top electrode material 42 for the capacitors 34 is also formed in the curved trench 73 while being deposited at the capacitor locations 72, it may be used to provide the contacts 38 or electrical connection for the top electrodes 42 along the curved trench 73 (see e.g., FIG. 19). Thus, using a method of fabricating the DRAM capacitors 34 in accordance with the present invention (as shown in FIGS. 2–20, for example), the contacts 38 for the top electrodes 42 of the capacitors may be self-aligned and formed from the top electrode material via the trenches 73.

Figure 21:
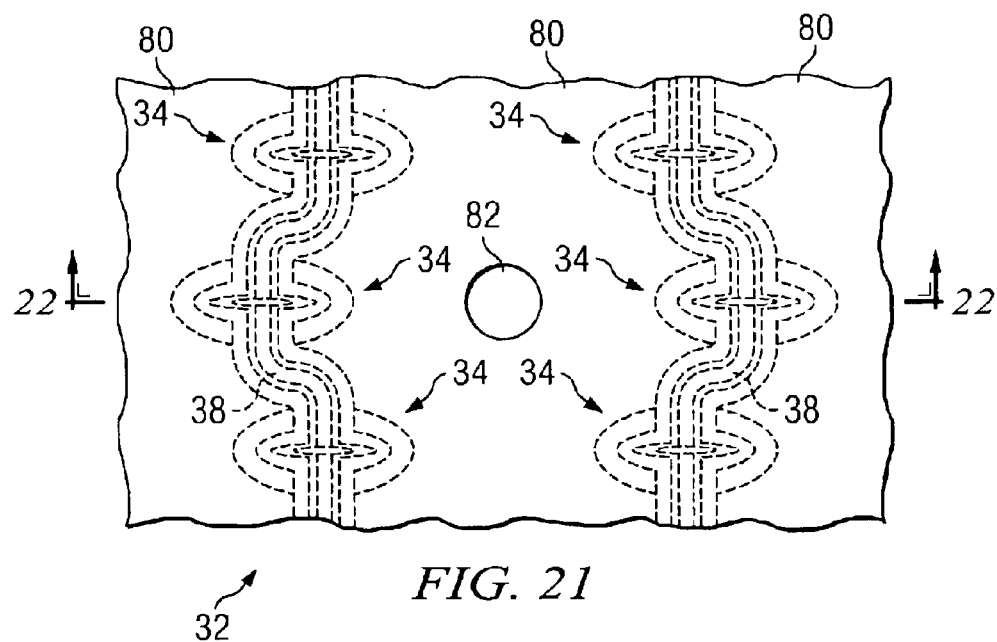
FIG. 21 is a top view of an intermediate structure of the illustrative embodiment at the DRAM region, subsequent to the intermediate structure shown in FIGS. 18–20.
Figure 22:
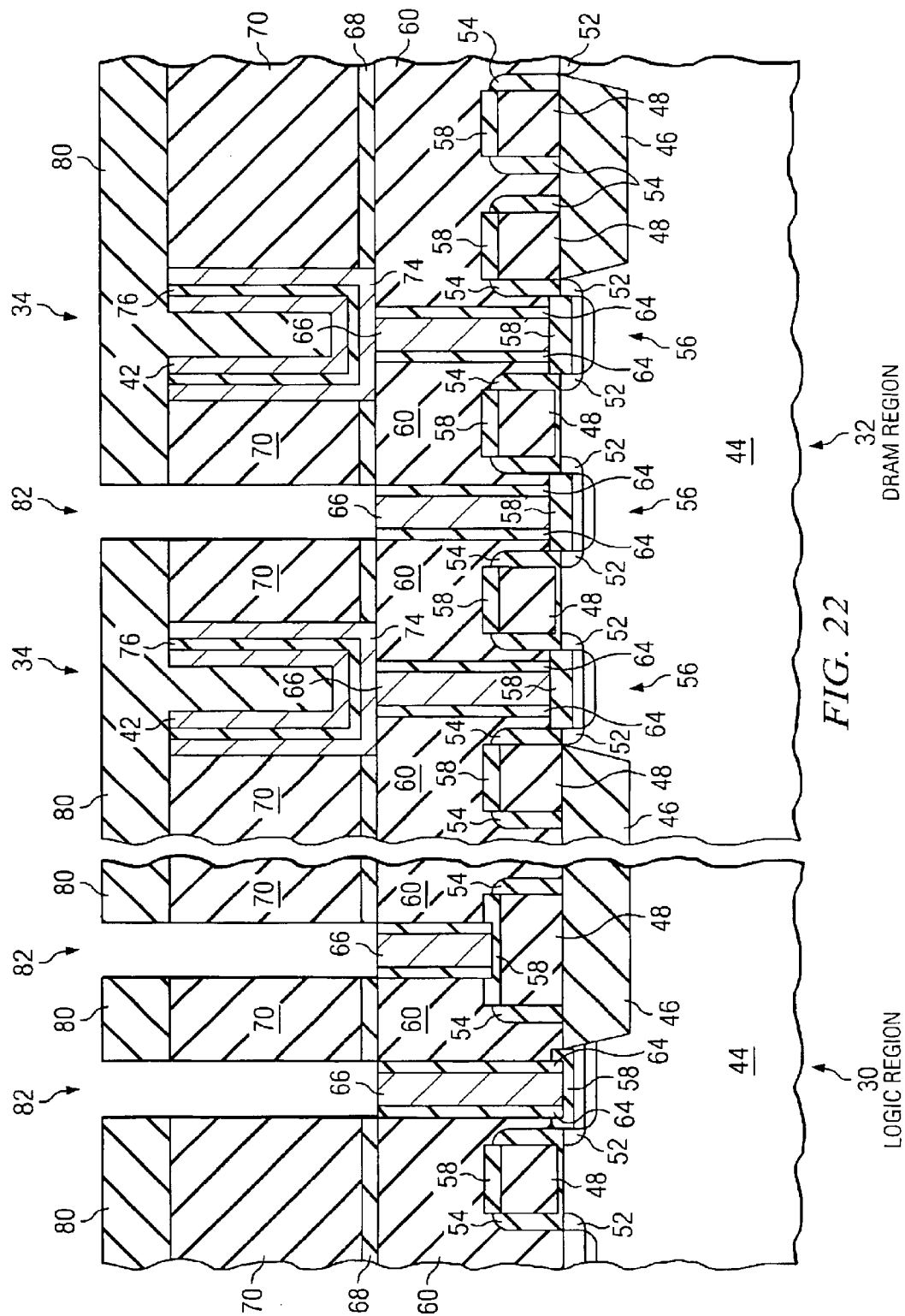
FIG. 22 is a cross-section view taken along line 22—22 in FIG. 21.

Referring next to FIGS. 21 and 22 and continuing with the process of forming the logic and DRAM regions 30, 32, an insulting cap layer 80 (e.g., an oxide) may be used to fill the remainder of the capacitor openings 72 and cover the top electrode material 42. After depositing the insulating cap layer 80, it may be planarized (e.g., using CMP) to provide a planar upper surface for the overall structure. Note that the underlying structures are shown in FIG. 21 through the insulating cap layer 80 for purposes of illustration. Contact openings 82 are formed in the logic and DRAM regions 30, 32 in alignment with other underlying contacts 66. The etch stop layer 68 may be used to control the stopping point for etching the contact openings 82. The contact openings 82 in the DRAM region may be used for the bit line contact 40.

Figure 23:
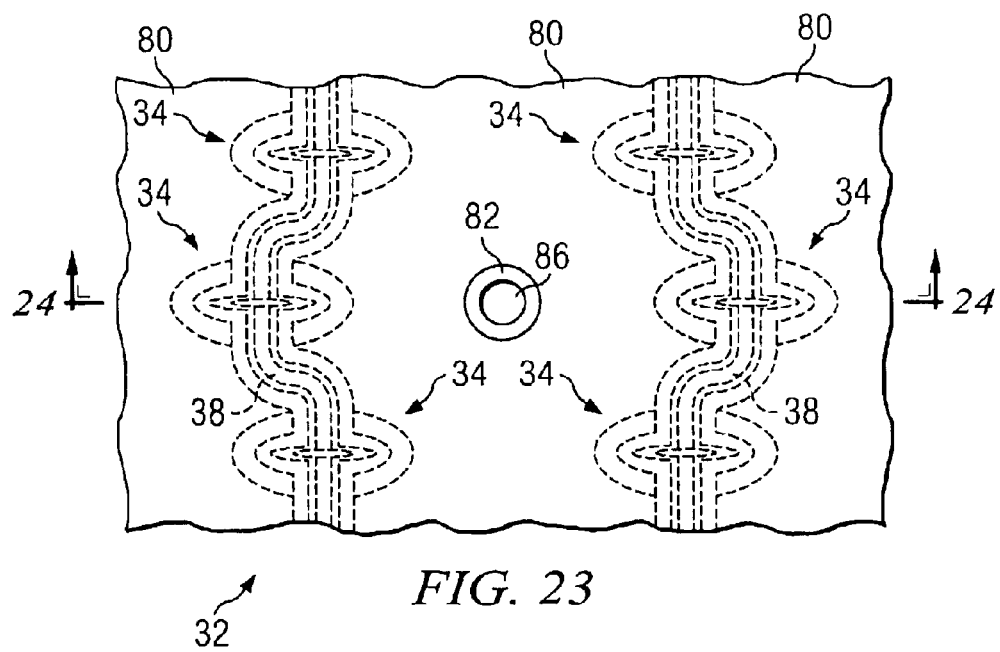
FIG. 23 is a top view of a structure of the illustrative embodiment at the DRAM region, subsequent to the intermediate structure shown in FIGS. 21 and 22.
Figure 24:
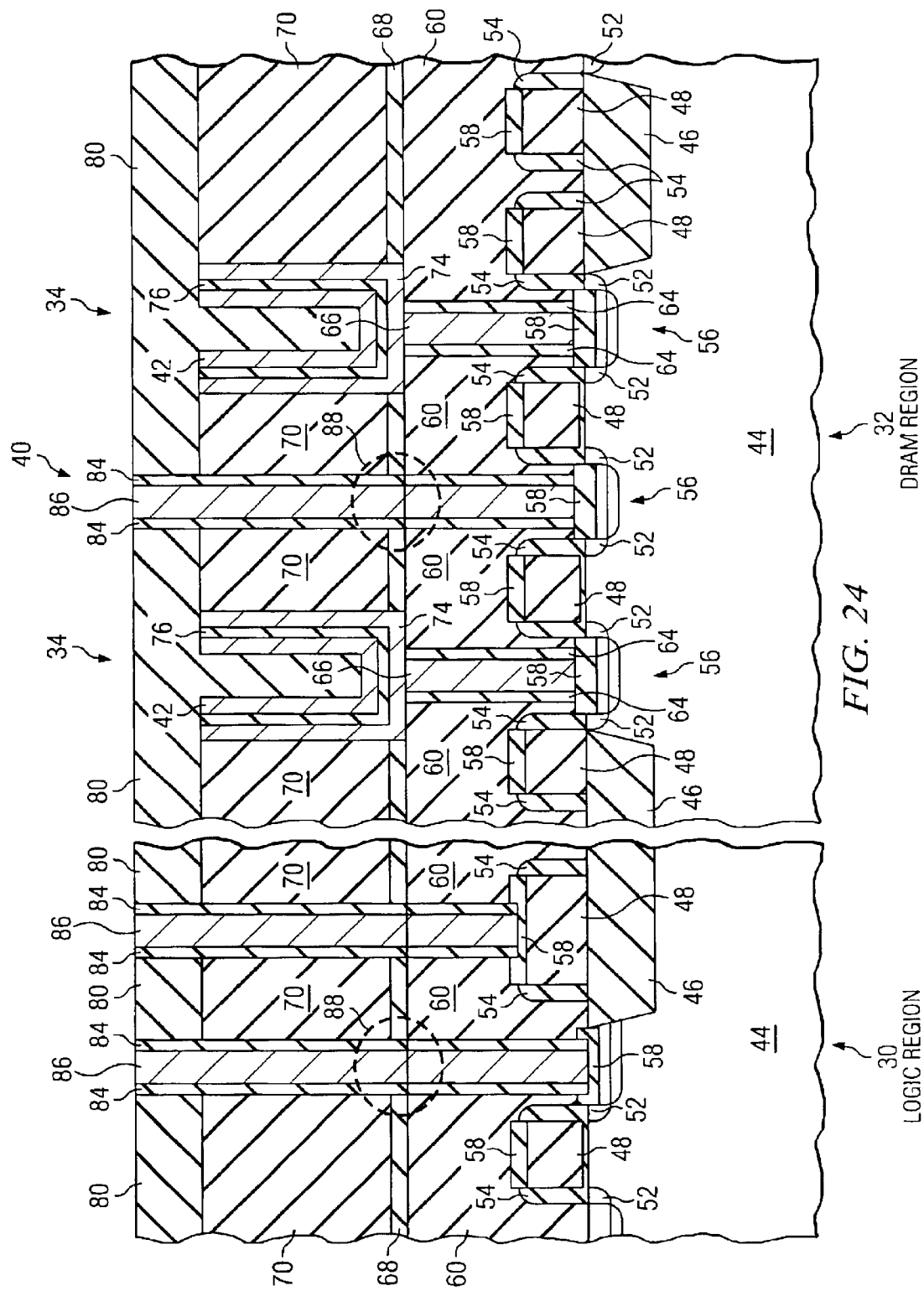
FIG. 24 is a cross-section view taken along line 23—23 in FIG. 23.

A barrier layer 84 may be formed within the contact opening, as shown in FIGS. 23 and 24. Contact material 86 (e.g., tungsten) is deposited into the contact openings 82. Excess contact material may need to be removed (e.g., using etch back or CMP) to provide a planar upper surface, as also shown in FIGS. 23 and 24. The region 88 encircled with a dashed line in FIG. 24 highlights that stacked contacts are formed in the logic region and in the DRAM region simultaneously using the same processing steps, which is another advantage to a method of the present invention. Also note in FIG. 24 the improved overlap margin between the top electrode 42 and the bit line contact 40, as compared with FIG. 1. This improved overlap margin window, as well as the self-aligning feature of the curved trench 73 in forming contacts 38 between top electrodes 42 of the storage capacitors, may allow for designs with higher device density and/or smaller device dimensions. These advantages provided by an embodiment of the present invention, as well as others, will be apparent to one of ordinary skill in the art with the benefit of this disclosure.

It will be appreciated by those skilled in the art having the benefit of this disclosure that embodiments of the present invention provide improvements in structure and processing for chips having logic and embedded DRAM arrays. The methods and structures shown herein may also be applied in other structures and devices. For example, methods and structures of an embodiment of the present invention may be used in the formation of DRAM devices in non-embedded applications. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A semiconductor device, comprising:
   a group of capacitors located at least partially in an insulating layer, each capacitor comprising a bottom electrode, a dielectric layer, and a top electrode,
   wherein at least part of the dielectric layer is located between the bottom and top electrodes,
   wherein the bottom electrode is formed in a cup-shaped opening, the cup-shaped opening being formed in the insulating layer, and
   wherein the dielectric layer and the top electrode are formed over the bottom electrode in the cup-shaped opening;
   a trench formed in the insulating layer, wherein the trench connects between and crosses each of the capacitors in the group, wherein the trench forms a recess in the bottom electrode where the trench crosses the bottom electrode; and
   a conductive material formed in the trench, wherein the conductive material electrically connects the top electrodes of the capacitors in the group.

2. The semiconductor device of claim 1, wherein the conductive material is formed from material of the top electrode when the top electrode material is formed.

3. The semiconductor device of claim 1, wherein the cup-shaped opening has a generally oval cross-section shape.

4. The semiconductor device of claim 1, wherein the cup-shaped opening has a round cross-section shape.

5. The semiconductor device of claim 1, wherein the cup-shaped opening has a generally rectangular cross-section shape.

6. The semiconductor device of claim 1, wherein the trench has a curved shape.

7. The semiconductor device of claim 1, wherein the trench has a generally rectangular cross-section shape.

8. The semiconductor device of claim 1, wherein the trench has a generally rounded-bottom cross-section shape.

9. The semiconductor device of claim 1, wherein the group of capacitors are storage capacitors forming parts of embedded dynamic random access memory cells on a chip that also includes a logic circuit region.

10. A semiconductor device, comprising:
- a group of capacitors located at least partially in an insulating layer, each capacitor comprising a first conductive material layer, a dielectric layer, and a second conductive material layer,
- wherein at least part of the dielectric layer is located between the first and second conductive material layers, and
- wherein the first conductive material layer coats an inside surface of a cup-shaped opening, the cup-shaped opening being formed in the insulating layer; and
- a trench formed in the insulating layer, wherein the trench extends between and crosses each of the capacitors in the group, wherein the trench forms a recess in the first conductive material layer where the trench crosses the first conductive material layer at the capacitors,
- wherein the dielectric layer and the second conductive material layer are formed over the first conductive material layer in the cup-shaped openings and over an inside surface of the trench, such that the second conductive material layer extends between the capacitors of the group via the trench, and such that the second conductive material layer forms top electrodes for the capacitors of the group.

* * * * *